(12) United States Patent
Murakami et al.

(10) Patent No.: US 10,819,338 B2
(45) Date of Patent: Oct. 27, 2020

(54) SENSOR

(71) Applicant: OMRON Corporation, Kyoto (JP)

(72) Inventors: Kohei Murakami, Kyoto (JP); Kazuhiro Kudo, Kyoto (JP); Keishi Yayama, Kyoto (JP); Toshiaki Ichiki, Kyoto (JP)

(73) Assignee: OMRON Corporation, Kyoto (JP)

( * ) Notice: Subject to any disclaimer, the term of this patent is extended or adjusted under 35 U.S.C. 154(b) by 114 days.

(21) Appl. No.: 16/251,086

(22) Filed: Jan. 18, 2019

(65) Prior Publication Data
US 2019/0288685 A1 Sep. 19, 2019

(30) Foreign Application Priority Data
Mar. 13, 2018 (JP) .................................. 2018-045536

(51) Int. Cl.
*G01R 1/02* (2006.01)
*H03K 17/94* (2006.01)
(Continued)

(52) U.S. Cl.
CPC ............. *H03K 17/94* (2013.01); *E05F 15/42* (2015.01); *G01R 1/02* (2013.01); *H01Q 1/2216* (2013.01);
(Continued)

(58) Field of Classification Search
CPC ........ H03K 17/94; H01Q 1/2216; E05F 15/42
See application file for complete search history.

(56) References Cited

U.S. PATENT DOCUMENTS

| 2006/0289204 A1* | 12/2006 | Twitchell, Jr. ....... H05K 5/0004 174/480 |
| 2007/0013236 A1* | 1/2007 | Fleiner ............... H03K 17/9525 307/326 |

(Continued)

FOREIGN PATENT DOCUMENTS

| JP | 2007518320 | 7/2007 |
| JP | 2017192733 | 10/2017 |
| WO | 2013098788 | 7/2013 |

OTHER PUBLICATIONS

Schneider Electric Industries France, "FCC ID Y7HXCSR—Internal photos", retrieved on Jul. 26, 2019, https://apps.fcc.gov/eas/GetApplicationAttachment.html?id=3387276.
(Continued)

*Primary Examiner* — Alvaro E Fortich
(74) *Attorney, Agent, or Firm* — JCIPRNET

(57) ABSTRACT

A sensor includes a housing and an antenna element. The first wall and the second wall of the housing are facing each other at a distance from each other. The third wall and the fourth wall connect the first wall and the second wall and are facing at a distance from each other and have a larger area than the first wall and the second wall respectively. The housing has an internal space surrounded by the first wall, the second wall, the third wall, and the fourth wall. The antenna element is arranged in the internal space of the housing and receives identification information of an external actuator for detecting opening/closing of a door. The antenna element is arranged at a position, which is closer to the first wall than the second wall and includes a substantially center in a direction connecting the third wall and the fourth wall.

3 Claims, 6 Drawing Sheets

(51) Int. Cl.
*E05F 15/42* (2015.01)
*H01Q 1/22* (2006.01)
(52) U.S. Cl.
CPC .. *E05Y 2400/852* (2013.01); *H03K 2217/958* (2013.01)

(56) References Cited

U.S. PATENT DOCUMENTS

2015/0348385 A1* 12/2015 Lamb .................... G08B 29/20
340/547
2016/0323118 A1* 11/2016 DiPoala ................ G08B 21/14

OTHER PUBLICATIONS

Schneider Electric Industries France, "FCC ID Y7HXCSR—Manual", retrieved on Jul. 26, 2019, https://apps.fcc.gov/eas/GetApplicationAttachment.html?id=3387281.
FCC Office of Engineering and Technology, "OET List Exhibits Report", retrieved on Jul. 26, 2019, https://apps.fcc.gov/oetcf/eas/reports/ViewExhibitReport.cfm?mode=Exhibits&RequestTimeout=500&calledFromFrame=N&application_id=ULBC5/swBNqvA09XQ/jXmA==&fcc_id=Y7HXCSR.
"Search Report of Europe Counterpart Application", dated Aug. 2, 2019, pp. 1-10.
Omron Corporation, "Compact Non-contact Door Switch D40Z," accessed Jan. 2019, Available at: http://www.fa.omron.co.jp/products/family/2989/download/catalog.html.
"Office Action of Korea Counterpart Application", dated Sep. 3, 2019, with English translation thereof, pp. 1-9.

* cited by examiner

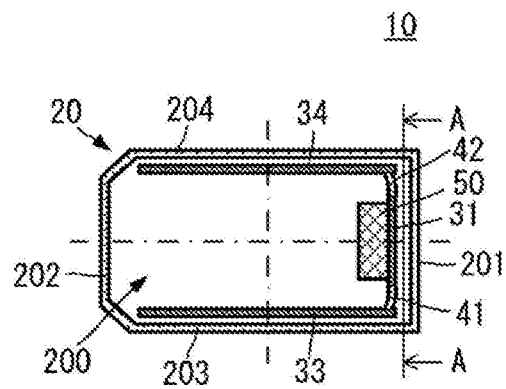
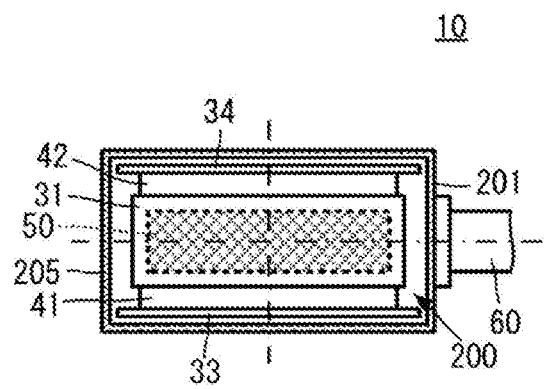
FIG. 3(A)  FIG. 3(B)
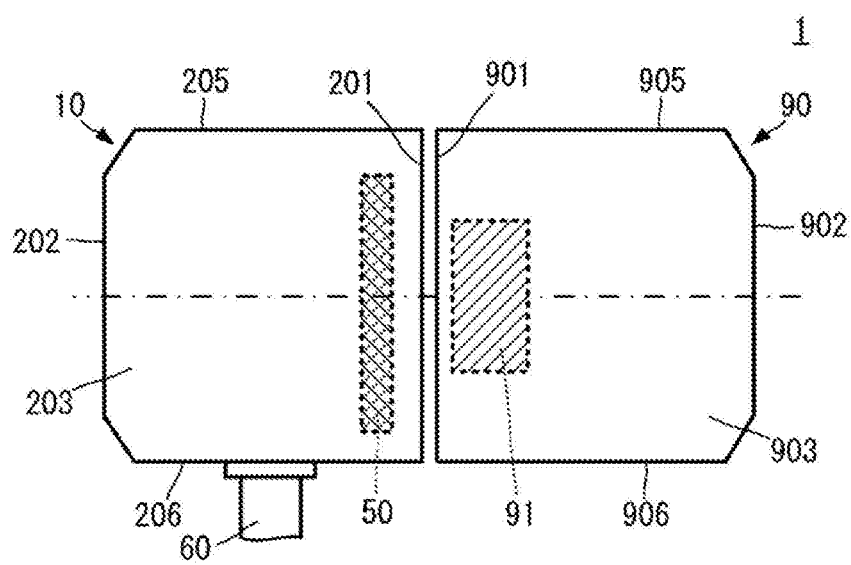
FIG. 4(A)
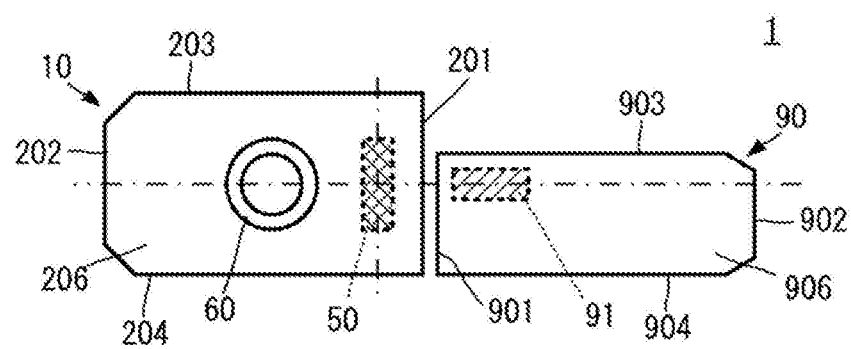
FIG. 4(B)

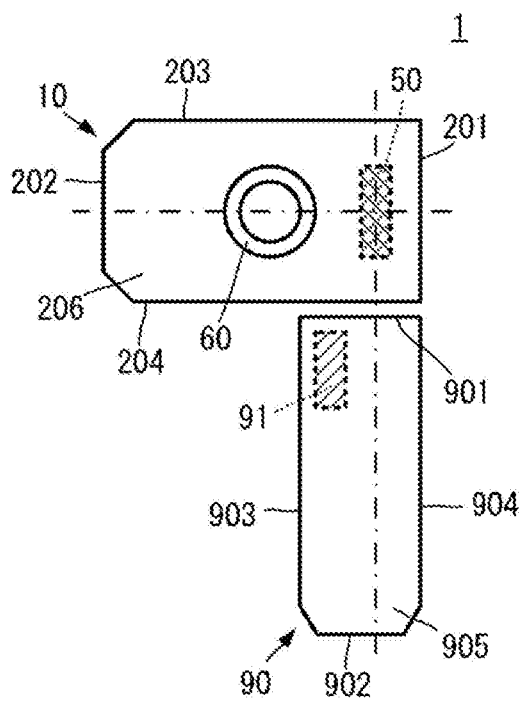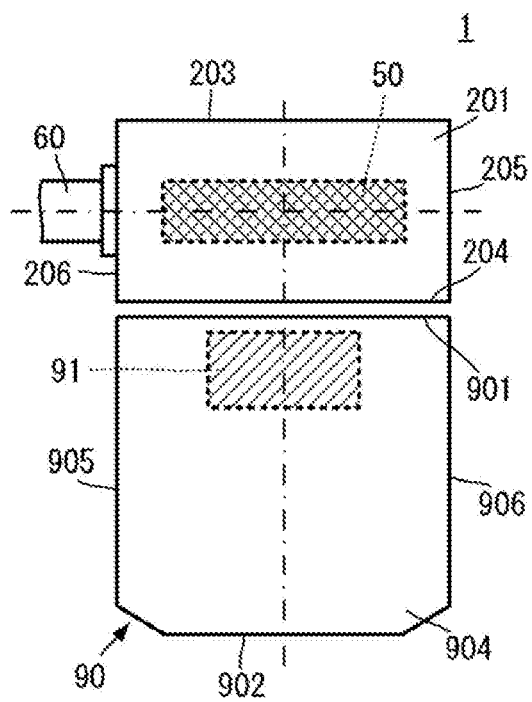
FIG. 5(A)                FIG. 5(B)
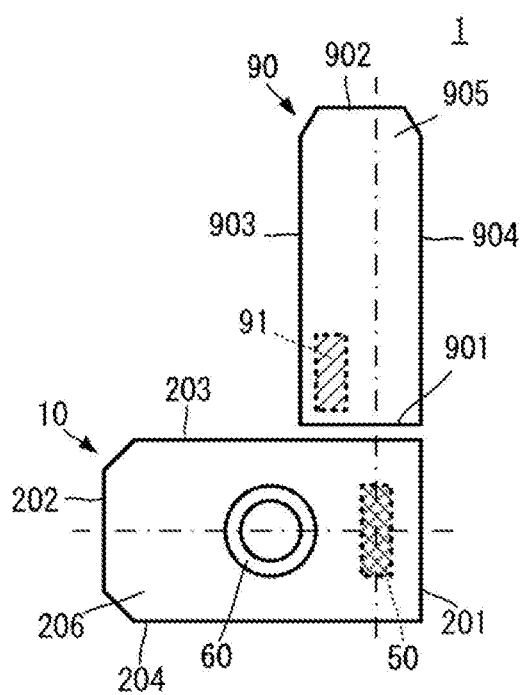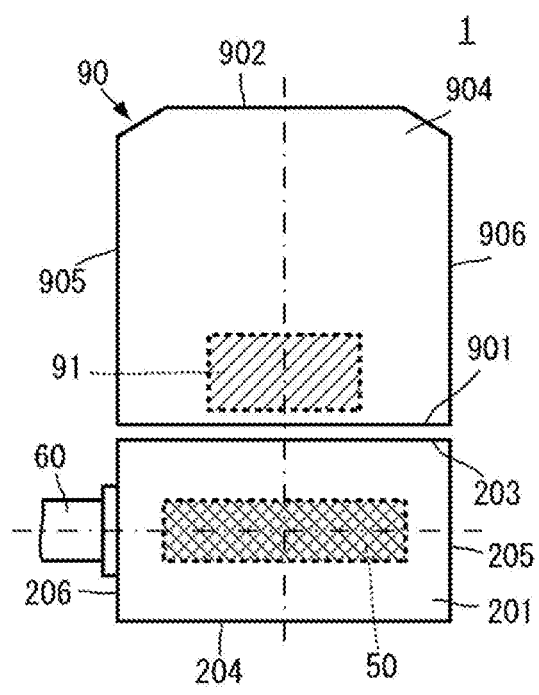
FIG. 6(A)                FIG. 6(B)

SENSOR

CROSS REFERENCE TO RELATED APPLICATION

The disclosure claims priority under 35 U.S.C. § 119 to Japanese Patent Application No. 2018-045536 filed on Mar. 13, 2018. The entire content of which is incorporated herein by reference.

BACKGROUND

Technical Field

The disclosure relates to a sensor used for a non-contact type switch such as a safety door switch.

Description of Related Art

At the manufacturing site, to ensure mechanical guard and operator safety, a safety door switch is provided for the manufacturing equipment. For example, as described in Non-Patent Document 1, there is a non-contact type door switch that detects opening/closing of a door in a non-contact manner.

The non-contact type door switch includes a sensor and an actuator. When the sensor and the actuator are close to each other, the sensor receives identification information from the actuator and detects that the actuator is approaching. On the other hand, when the sensor and the actuator are away from each other, the sensor cannot receive the identification information from the actuator and detects that the actuator is moving away.

The non-contact type door switch detects the opening/closing state of the door by using this principle.

RELATED ART

Non-Patent Document(s)

[Non-Patent Document 1]
http://www.fa.omron.co.jp/products/family/2989/download/catalog.html However, in the conventional non-contact type door switch, the positional relationship between the sensor and the actuator at the time of approaching is limited. As a result, arrangement of the sensor and the actuator to the manufacturing equipment is limited.

Therefore, the disclosure provides a structure of a sensor that can reliably detect the opening/closing of a door while improving the flexibility of the positional relationship between a sensor and an actuator at the time of approaching.

SUMMARY

According to an example of the disclosure, a sensor includes a housing and an antenna element. The housing includes a first wall, a second wall, a third wall, and a fourth wall. The first wall and the second wall are facing each other at a distance from each other. The third wall and the fourth wall connect the first wall and the second wall and are facing each other at a distance from each other and have a larger area than the first wall and the second wall respectively. The housing has an internal space surrounded by the first wall, the second wall, the third wall, and the fourth wall. The antenna element is arranged in the internal space of the housing and receives identification information of an external actuator for detecting opening/closing of a door. The antenna element is arranged at a position, which is closer to the first wall than the second wall and includes a substantially center in a direction connecting the third wall and the fourth wall.

BRIEF DESCRIPTION OF THE DRAWINGS

FIG. 3(A) is a cross-sectional view of the plane of the sensor, and FIG. 3(B) is a cross-sectional view (A-A cross-sectional view of FIG. 3(A)) of the front of the sensor.

FIG. 4(A) is a side view showing a first example of arrangement, and FIG. 4(B) is a bottom view showing the first example of arrangement.

FIG. 5(A) is a bottom view showing a second example of arrangement, and FIG. 5(B) is a front view showing the second example of arrangement.

FIG. 6(A) is a bottom view showing a third example of arrangement, and FIG. 6(B) is a front view showing the third example of arrangement.

DESCRIPTION OF THE EMBODIMENTS

Hereinafter, the embodiments of the disclosure will be described with reference to the drawings.

Application Example

Figure 7A:
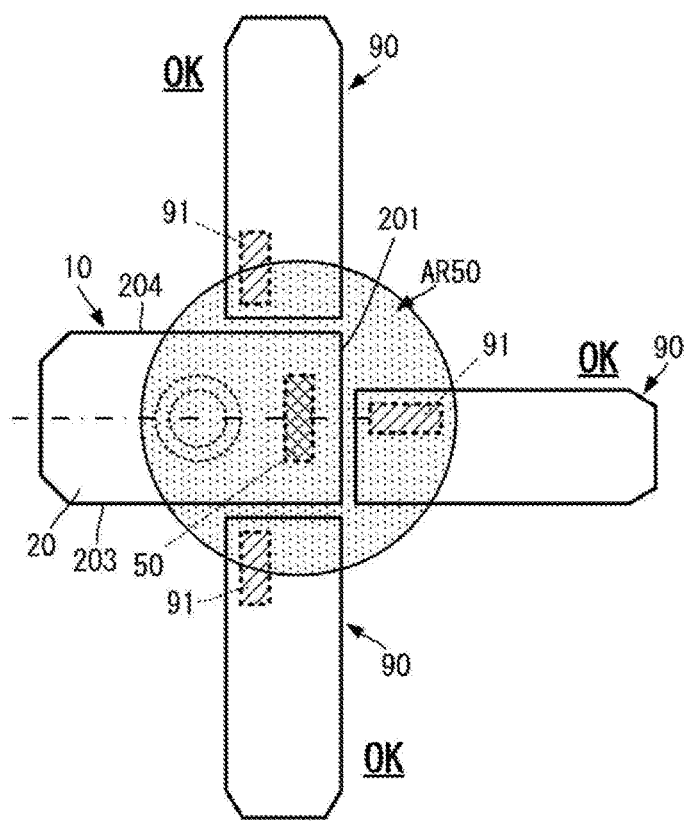
FIG. 7(A) is a view showing the detection range of identification information from the actuator in the sensor of the disclosure.
Figure 7B:
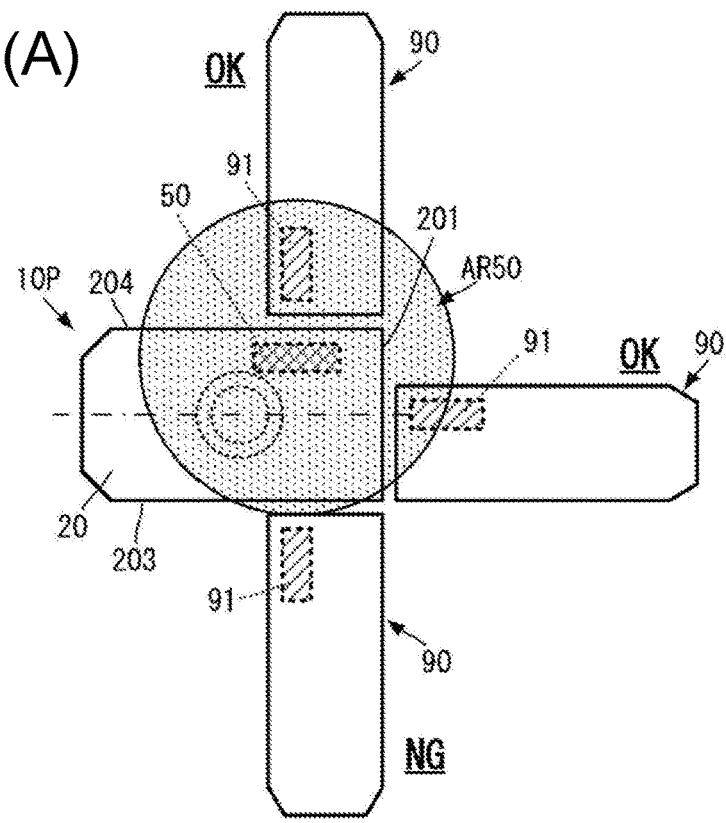
FIG. 7(B) is a view showing the detection range of identification information from the actuator in a conventional sensor.

First, an application example of a sensor according to an embodiment of the disclosure will be described. FIG. 7(A) is a view showing the detection range of identification information from the actuator in the sensor of the disclosure, and FIG. 7(B) is a view showing the detection range of identification information from the actuator in a conventional sensor.

As shown in FIG. 7(A), a sensor 10 includes a housing 20 and an antenna element 50. The housing 20 has a substantially rectangular parallelepiped shape and has an internal space. The housing 20 is provided with a first wall 201 as one end in the longitudinal direction and a third wall 203 and a fourth wall 204 as two ends in the width direction. The first wall 201 is orthogonal to the third wall 203 and the fourth wall 204.

The antenna element 50 is arranged in the internal space of the housing 20. The antenna element 50 has a rod shape and has, for example, an omnidirectional radiation characteristic. The antenna element 50 is arranged in the vicinity of the first wall 201. The antenna element 50 is arranged so that the longitudinal direction of the rod extends along the first wall 201.

With such a configuration, regardless of whether an actuator 90 is close to the first wall 201 as in a first example, the actuator 90 is close to the third wall 203 as in a second example, and the actuator 90 is close to the fourth wall 204 as in a third example, an RFID (radio frequency identification) tag 91 of the actuator 90 overlaps a communicable area AR50 of the antenna element 50. Therefore, in any of the examples, the antenna element 50 can receive the identification information from the RFID tag 91, and the sensor 10 can detect the actuator 90 (shown as "OK" in FIG. 7(A)).

On the other hand, as shown in FIG. 7(B), in the conventional configuration, the antenna element 50 is mounted on a substrate (not shown) arranged in parallel to the fourth wall 204 of the housing 20. Therefore, there is almost no communicable area AR50 on the outer side of the third wall 203. As a result, even if the actuator 90 is brought close to the third wall 203, the antenna element 50 cannot receive the identification information from the RFID tag 91, and a sensor 10P of the conventional configuration cannot detect the actuator 90 (shown as "NG" in FIG. 7(B)).

As described above, by using the configuration of the sensor 10 according to the present embodiment, it is possible to reliably detect the opening/closing of the door while improving the flexibility of the positional relationship between the sensor and the actuator at the time of approaching.

Configuration Example

Figure 1:
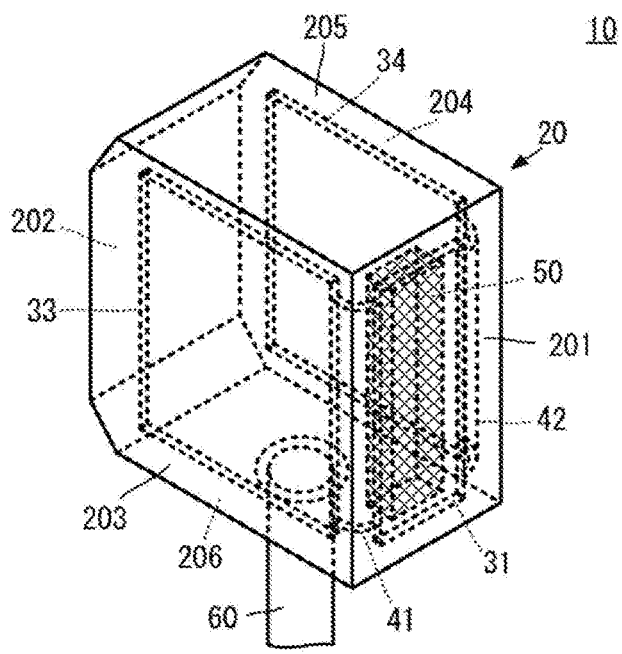
FIG. 1 is a perspective view showing a main structure of a sensor according to a first embodiment of the disclosure.
Figure 2A:
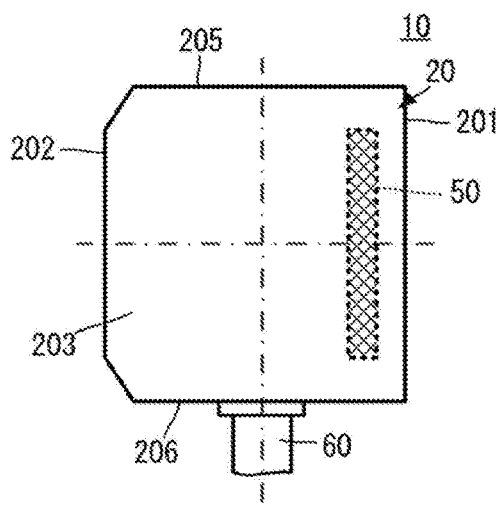
FIG. 2(A) is a side view of the sensor.
Figure 2B:
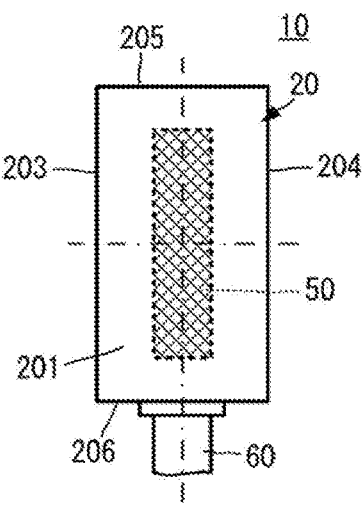
FIG. 2(B) is a front view of the sensor.
Figure 2C:
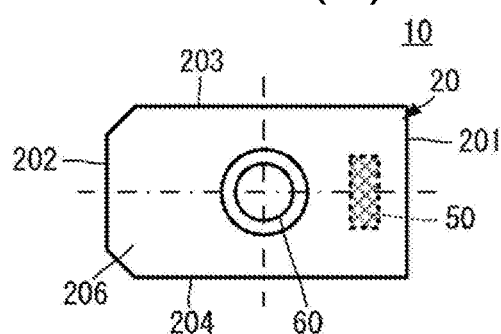
FIG. 2(C) is a bottom view of the sensor.

A sensor according to the embodiment of the disclosure will be described with reference to the drawings. FIG. 1 is a perspective view showing a main structure of a sensor according to a first embodiment of the disclosure. FIG. 2(A) is a side view of the sensor, FIG. 2(B) is a front view of the sensor, and FIG. 2(C) is a bottom view of the sensor. FIG. 3(A) is a cross-sectional view of the plane of the sensor, and FIG. 3(B) is a cross-sectional view of the front of the sensor. FIG. 3(B) is an A-A cross-sectional view of FIG. 3(A).

As shown in FIG. 1, FIG. 2(A), FIG. 2(B), FIG. 2(C), FIG. 3(A), and FIG. 3(B), the sensor 10 includes a housing 20, an antenna mounting substrate 31, a circuit substrate 33, a circuit substrate 34, a flexible substrate 41, a flexible substrate 42, an antenna element 50, and an external connector 60.

The housing 20 has a substantially rectangular parallelepiped shape. The housing 20 has a first wall 201, a second wall 202, a third wall 203, a fourth wall 204, a fifth wall 205, and a sixth wall 206. The first wall 201, the second wall 202, the third wall 203, the fourth wall 204, the fifth wall 205, and the sixth wall 206 each have a flat plate shape.

The first wall 201 and the second wall 202 have rectangular shapes in which the length of one side of the planar shape is greater than the length of another side. The first wall 201 and the second wall 202 are arranged to face each other while being spaced apart in a direction orthogonal to the plane.

The third wall 203 and the fourth wall 204 have rectangular shapes in which the length of one side of the planar shape is greater than the length of another side. In this case, the ratio of the length of one side to the length of another side of the third wall 203 and the fourth wall 204 is closer to 1 than the ratio of the length of one side to the length of another side of the first wall 201 and the second wall 202.

The third wall 203 and the fourth wall 204 are arranged to face each other while being spaced apart in a direction orthogonal to the plane.

The third wall 203 is connected to one long side of the first wall 201 and one long side of the second wall 202. The fourth wall 204 is connected to the other long side of the first wall 201 and the other long side of the second wall 202.

The fifth wall 205 and the sixth wall 206 have rectangular shapes in which the length of one side of the planar shape is greater than the length of another side. The fifth wall 205 and the sixth wall 206 are arranged to face each other while being spaced apart in a direction orthogonal to the plane.

The fifth wall 205 is connected to one short side of the first wall 201 and one short side of the second wall 202. The sixth wall 206 is connected to the other short side of the first wall 201 and the other short side of the second wall 202.

With such a structure, the housing 20 has an internal space 200 surrounded by the first wall 201, the second wall 202, the third wall 203, the fourth wall 204, the fifth wall 205, and the sixth wall 206.

The antenna mounting substrate 31, the circuit substrate 33, the circuit substrate 34, the flexible substrate 41, the flexible substrate 42, and the antenna element 50 are arranged in the internal space 200 of the housing 20. The external connector 60 is formed on the sixth wall 206.

The antenna mounting substrate 31, the circuit substrate 33, and the circuit substrate 34 are substrates having almost no flexibility, i.e., the so-called rigid substrates. The flexible substrate 41 and the flexible substrate 42 are substrates having flexibility. The antenna mounting substrate 31 and the circuit substrate 33 are physically and electrically connected via the flexible substrate 41. The antenna mounting substrate 31 and the circuit substrate 34 are physically and electrically connected via the flexible substrate 42.

The antenna mounting substrate 31 has a shape similar to that of the first wall 201. The antenna mounting substrate 31 is arranged close to and parallel to the first wall 201. In this case, the longitudinal direction of the antenna mounting substrate 31 and the longitudinal direction of the first wall 201 are substantially parallel.

The antenna element 50 has a rod shape and has an omnidirectional radiation characteristic. However, the antenna element 50 may also have a unidirectional radiation characteristic in which a direction orthogonal to the center in the longitudinal direction of the rod shape is the central axis of directivity.

The antenna element 50 is mounted on the antenna mounting substrate 31. In this case, the antenna element 50 is mounted on the antenna mounting substrate 31 so that its longitudinal direction is substantially parallel to the longitudinal direction of the antenna mounting substrate 31.

As a result, the antenna element 50 is arranged substantially parallel to the first wall 201 so that its longitudinal direction is substantially parallel to the longitudinal direction of the first wall 201. Further, the antenna element 50 is arranged in the vicinity of the first wall 201.

The circuit substrate 33 has a shape similar to that of the third wall 203, and the circuit substrate 34 has a shape similar to that of the fourth wall 204.

The circuit substrate 33 is arranged close to and parallel to the third wall 203, and the circuit substrate 34 is arranged close to and parallel to the fourth wall 204. That is, the circuit substrate 33 and the circuit substrate 34 are arranged so as to be substantially orthogonal to the antenna mounting substrate 31. Even with such an arrangement relationship, by using the flexible substrate 41 and the flexible substrate 42, the circuit substrate 33 and the circuit substrate 34 can be connected to the antenna mounting substrate 31.

On the circuit substrate 33 and the circuit substrate 34, circuit elements, etc. for implementing modulation and demodulation of the identification information using the antenna element 50 are mounted.

The sensor 10 having such a structure is used in a safety switch (e.g., door opening/closing detection system) as described below. FIG. 4(A) is a side view showing a first example of arrangement, and FIG. 4(B) is a bottom view showing the first example of arrangement. The side view of FIG. 4(A) is a view viewed from the side of the third wall 203 of the sensor 10, and the bottom view of FIG. 4(B) is a view viewed from the side of the sixth wall 206 of the sensor 10. FIG. 5(A) is a bottom view showing a second example of arrangement, and FIG. 5(B) is a front view showing the second example of arrangement. The bottom view of FIG. 5(A) is a view viewed from the side of the sixth wall 206 of the sensor 10, and the front view of FIG. 5(B) is a view viewed from the side of the first wall 201 of the sensor 10. FIG. 6(A) is a bottom view showing a third example of arrangement, and FIG. 6(B) is a front view showing the third example of arrangement. The bottom view of FIG. 6(A) is a view viewed from the side of the sixth wall 206 of the sensor 10, and the front view of FIG. 6(B) is a view viewed from the side of the first wall 201 of the sensor 10.

Also, as described above, FIG. 7(A) is a view showing the detection range of the RFID actuator in the sensor of the disclosure, and FIG. 7(B) is a view showing the detection range of the RFID actuator in the conventional sensor.

As shown in FIG. 4(A), FIG. 4(B), FIG. 5(A), FIG. 5(B), FIG. 6(A), and FIG. 6(B), a safety switch 1 includes the sensor 10 and the actuator 90. The actuator 90 is provided with a housing having a rectangular parallelepiped shape. Like the sensor 10, the housing of the actuator 90 has a first wall 901, a second wall 902, a third wall 903, a fourth wall 904, a fifth wall 905, and a sixth wall 906. The housing of the actuator 90 is thinner than the housing of the sensor 10. That is, the length in the width direction of the first wall 901 and the second wall 902 of the actuator 90 is smaller than the length in the width direction of the first wall 201 and the second wall 202 of the sensor 10.

The actuator 90 includes the RFID tag 91. The RFID tag 91 is arranged in the vicinity of the first wall 901 and the third wall 903 of the housing of the actuator 90.

(First Example of Arrangement)

As shown in FIG. 4(A) and FIG. 4(B), the actuator 90 is arranged close to the side of the first wall 201 of the sensor 10. In this case, the first wall 901 of the actuator 90 and the first wall 201 of the sensor 10 face each other. Also, the fourth wall 904 of the actuator 90 and the fourth wall 204 of the sensor 10 are substantially flush with each other.

With such a configuration, the antenna element 50 of the sensor 10 and the RFID tag 91 of the actuator 90 are close to each other.

(Second Example of Arrangement)

As shown in FIG. 5(A) and FIG. 5(B), the actuator 90 is arranged close to the side of the fourth wall 204 of the sensor 10. In this case, the first wall 901 of the actuator 90 and the fourth wall 204 of the sensor 10 face each other. Also, the fourth wall 904 of the actuator 90 and the first wall 201 of the sensor 10 are substantially flush with each other.

With such a configuration, the antenna element 50 of the sensor 10 and the RFID tag 91 of the actuator 90 are close to each other.

(Third Example of Arrangement)

As shown in FIG. 6(A) and FIG. 6(B), the actuator 90 is arranged close to the side of the third wall 203 of the sensor 10. In this case, the first wall 901 of the actuator 90 and the third wall 203 of the sensor 10 face each other. Also, the fourth wall 904 of the actuator 90 and the first wall 201 of the sensor 10 are substantially flush with each other.

With such a configuration, the antenna element 50 of the sensor 10 and the RFID tag 91 of the actuator 90 are close to each other.

As shown in FIG. 7(A), by using the configuration of the sensor 10 of the present embodiment, the communicable area AR50 of the antenna element 50 spreads out by a predetermined size not only to outside of the first wall 201 but also to outside of the third wall 203 and to outside of the fourth wall 204. Therefore, regardless of whether it is in the first example, the second example, or the third example, the RFID tag 91 overlaps the communicable area AR50. Thus, regardless of whether it is in the first example, the second example, or the third example, the antenna element 50 can receive the identification information from the RFID tag 91, and the sensor 10 can detect the actuator 90.

On the other hand, as shown in FIG. 7(B), in the conventional configuration, the communicable area AR50 of the antenna element 50 spreads out by a predetermined size to outside of the first wall 201 and to outside of the fourth wall 204 but hardly spreads out to outside of the third wall 203. Therefore, in the first example and the third example, the RFID tag 91 overlaps the communicable area AR50, but in the second example, the RFID tag 91 does not overlap with the communicable area AR50. As a result, even if the actuator 90 is brought close to the third wall 203, the antenna element 50 cannot receive the identification information from the RFID tag 91, and in the second example, the sensor 10P of the conventional configuration cannot detect the actuator 90.

As described above, by using the configuration of the sensor 10 of the present embodiment, it is possible to reliably detect the opening/closing of the door while improving the flexibility of the positional relationship between the sensor and the actuator at the time of approaching.

In the conventional structure, by adding the antenna element also in the vicinity of the third wall 203, it is also possible to detect the RFID tag 91 on the side of the third wall 203. However, the number of components of the sensor would increase.

Therefore, by using the sensor 10 of the present embodiment, while a simple configuration is provided, the flexibility of the positional relationship between the sensor and the actuator at the time of approaching can be improved.

Figure 8A:
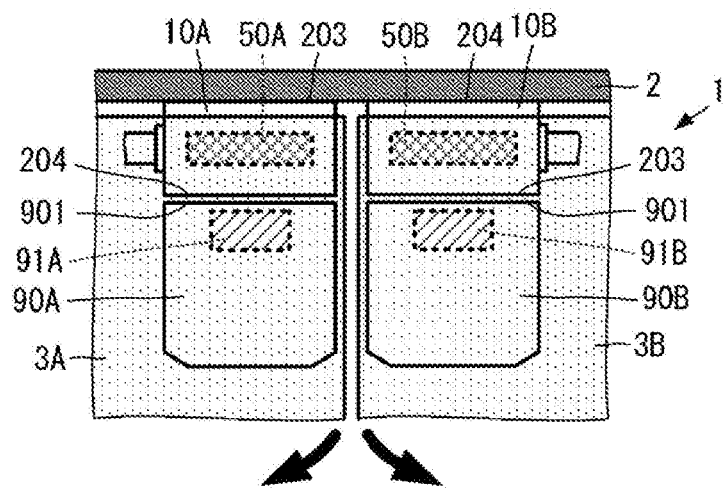
FIG. 8(A) shows a first configuration example of the double door.
Figure 8B:
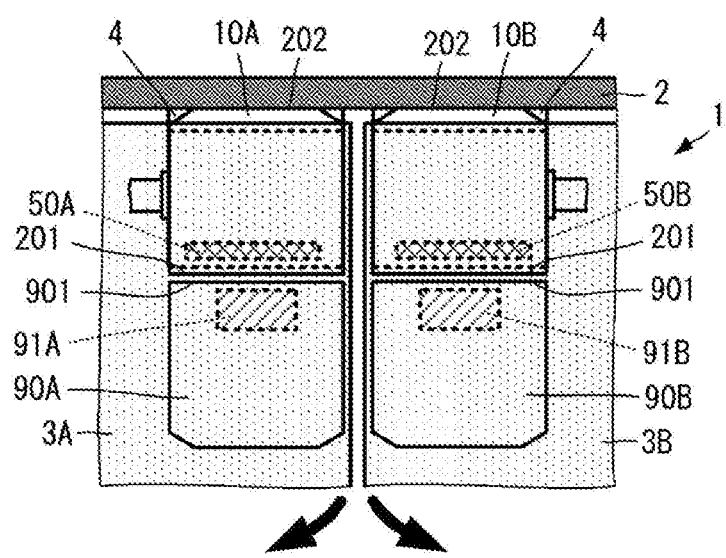
FIG. 8(B) shows a second configuration example of the double door.
Figure 9A:
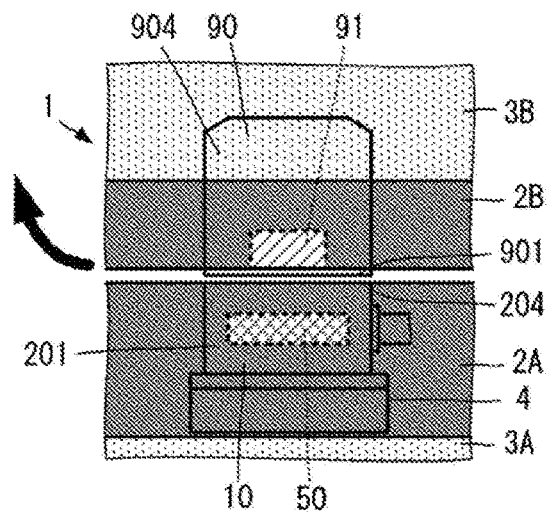
FIG. 9(A) shows a first configuration example of the gull-wing door.
Figure 9B:
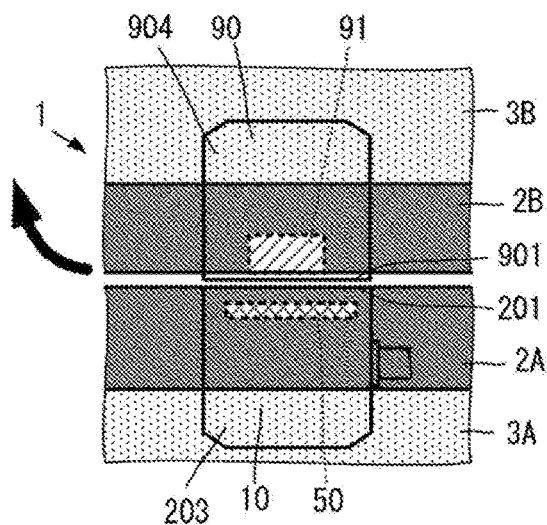
FIG. 9(B) shows a second configuration example of the gull-wing door.

The safety switch 1 having the above configuration may be adopted as a safety switch of, for example, a double door shown in FIG. 8(A) and FIG. 8(B) and a gull-wing door shown in FIG. 9(A) and FIG. 9(B).

FIG. 8(A) shows a first configuration example of the double door, and FIG. 8(B) shows a second configuration example of the double door.

In the first configuration example shown in FIG. 8(A), a sensor 10A and a sensor 10B are fixed side by side to a frame 2. The third wall 203 of the sensor 10A is in contact with the frame 2, and the fourth wall 204 of the sensor 10B is in contact with the frame 2.

An actuator 90A is fixed to a door 3A so that the first wall 901 faces the side of the frame 2. An actuator 90B is fixed to a door 3B so that the first wall 901 faces the side of the frame 2.

In the second configuration example shown in FIG. 8(B), the sensor 10A and the sensor 10B are fixed side by side to the frame 2. The second walls 202 of the sensor 10A and the sensor 10B are in contact with the frame 2. This configuration example may be realized, for example, by fixing the sensor 10A and the sensor 10B to the frame 2 via an L-shaped jig 4, as shown in FIG. 8(B).

The actuator 90A is fixed to the door 3A so that the first wall 901 faces the side of the frame 2. The actuator 90B is fixed to the door 3B so that the first wall 901 faces the side of the frame 2.

In these configurations, when the door 3A is open, the sensor 10A cannot detect the actuator 90A, and when the door 3A is closed, the sensor 10A detects the actuator 90A. Also, when the door 3B is open, the sensor 10B cannot detect the actuator 90B, and when the door 3B is closed, the sensor 10B detects the actuator 90B.

FIG. 9(A) shows a first configuration example of the gull-wing door, and FIG. 9(B) shows a second configuration example of the gull-wing door.

In the first configuration example shown in FIG. 9(A), the sensor 10 is fixed to a fixed frame 2A. The first wall 201 of the sensor 10 is in contact with the fixed frame 2A so that the fourth wall 204 faces the side of a movable frame 2B. This configuration example may be realized, for example, by fixing the sensor 10 to the fixed frame 2A via the L-shaped jig 4, as shown in FIG. 9(A).

The actuator 90 is fixed to the movable frame 2B and the door 3B so that the first wall 901 faces the side of the fixed frame 2A. The fourth wall 904 of the actuator 90 is in contact with the movable frame 2B. In an example, the third wall 903 of the actuator 90 may be in contact with the movable frame 2B, but in the configuration described above, the fourth wall 904 is preferably in contact with the movable frame 2B.

In the second configuration example shown in FIG. 9(B), the sensor 10 is fixed to the fixed frame 2A. The third wall 203 of the sensor 10 is in contact with the fixed frame 2A so that the first wall 201 faces the side of the movable frame 2B.

The actuator 90 is fixed to the movable frame 2B and the door 3B so that the first wall 901 faces the side of the fixed frame 2A. The fourth wall 904 of the actuator 90 is in contact with the movable frame 2B. In an example, the third wall 903 of the actuator 90 may be in contact with the movable frame 2B, but in the configuration described above, the fourth wall 904 is preferably in contact with the movable frame 2B.

In these configurations, when the door 3B is open, the sensor 10 cannot detect the actuator 90, and when the door 3B is closed, the sensor 10 detects the actuator 90.

In the above description, the antenna element 50 is mounted on the antenna mounting substrate 31, but a discrete antenna element having a wire terminal for connection may also be used.

Figure 10A:
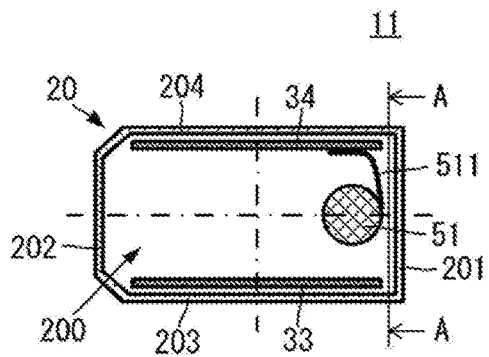
FIG. 10(A) is a cross-sectional view of the plane of a sensor of another configuration.
Figure 10B:
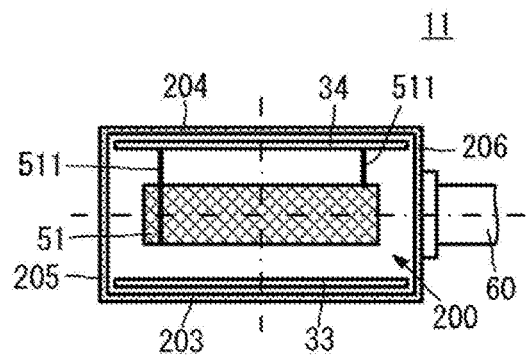
FIG. 10(B) is a cross-sectional view of the front of the sensor of the another configuration.

FIG. 10(A) is a cross-sectional view of the plane of a sensor of another configuration, and FIG. 10(B) is a cross-sectional view of the front of the sensor of the another configuration.

As shown in FIG. 10(A) and FIG. 10(B), a sensor 11 includes an antenna element 51. The antenna element 51 has a wire terminal 511 for connection. The rest of the configuration of the sensor 11 is similar to that of the sensor 10 described above, and descriptions of similar parts are omitted.

The antenna element 51 has a rod shape and is arranged in the internal space 200 of the housing 20 so that its longitudinal direction is parallel to the longitudinal direction of the first wall 201. The antenna element 51 is arranged in the vicinity of the first wall 201. The wire terminal 511 of the antenna element 51 is connected to the circuit substrate 34, for example. Even with such a configuration, it is possible to obtain the same function and effect as those of the sensor 10 described above. Also, with this configuration, the antenna mounting substrate 31, the flexible substrate 41, and the flexible substrate 42 may be omitted.

In the above description, the example in which the antenna element 51 is arranged in the vicinity of the first wall 201 has been illustrated. Here, "vicinity" may be a range in which the communicable area AR50 with a desired distance can be formed outward from the first wall 201 as a radiation characteristic. For example, taking the antenna characteristic of the antenna element 51 into consideration, the antenna element 51 may be arranged at a position closer to the first wall 201 than the second wall 202.

Also, in the above description, the example of using the flexible substrate 41 and the flexible substrate 42 as the connecting member between the antenna mounting substrate 31 and the circuit substrate 33 and the circuit substrate 34 has been illustrated. However, in an example, a connector terminal may also be used as the connecting member. That is, as long as the flat plate surface of the antenna mounting substrate 31 is connected to the flat plate surfaces of the circuit substrate 33 and the circuit substrate 34, for example, in a substantially orthogonal state, other connection examples may also be used.

With this configuration, the antenna element receives the identification information of the actuator even when the actuator approaches any one of the first wall, the third wall, and the fourth wall.

Also, according to an example of the disclosure, in the internal space of the housing, the sensor includes a main circuit substrate having a flat plate shape and parallel to the third wall or the fourth wall, an antenna mounting substrate arranged parallel to a surface of the first wall, wherein the antenna element is mounted on the antenna mounting substrate, and a connecting member physically and electrically connecting the main circuit substrate and the antenna mounting substrate.

With this configuration, the antenna element is reliably arranged in the vicinity of the first wall and at a substantially middle position between the third wall and the fourth wall with a simple structure.

Also, according to an example of the disclosure, the antenna element is omni-directional or has a directivity in a direction orthogonal to the surface of the first wall, a surface of the third wall, and a surface of the fourth wall.

With this configuration, the radiation of the electromagnetic field to the outer surfaces of the first wall, the third wall, and the fourth wall becomes substantially uniform.

Further, according to an example of the disclosure, a length of the first wall in a direction parallel to the third wall and the fourth wall is greater than a length of the first wall in a direction orthogonal to the third wall and the fourth wall. The antenna element has a rod shape in which a length in a direction parallel to the first wall, the third wall, and the fourth wall is greater than a length in a direction orthogonal to the third wall and the fourth wall.

With this configuration, a sensor having a short length in a direction orthogonal to the third wall and the fourth wall (i.e., having a small thickness in one direction) is realized.

According to the disclosure, it is possible to reliably detect the opening/closing of the door while improving the flexibility of the positional relationship between the sensor and the actuator at the time of approaching.

What is claimed is:

1. A sensor comprising:
a housing comprising a first wall, a second wall, a third wall, a fourth wall, and an internal space, wherein the first wall and the second wall are facing each other at a distance from each other, the third wall and the fourth wall connect the first wall and the second wall and are facing each other at a distance from each other and have a larger area than the first wall and the second wall respectively, and the internal space is surrounded by the first wall, the second wall, the third wall, and the fourth wall; and
an antenna element arranged in the internal space of the housing and receiving identification information of an external actuator for detecting opening/closing of a door,
wherein the antenna element is arranged at a position, which is closer to the first wall than the second wall and includes a substantially center in a direction connecting the third wall and the fourth wall,
wherein in the internal space of the housing, the sensor comprises:
a main circuit substrate having a flat plate shape and parallel to the third wall or the fourth wall;
an antenna mounting substrate arranged parallel to a surface of the first wall, wherein the antenna element is mounted on the antenna mounting substrate; and
a connecting member physically and electrically connecting the main circuit substrate and the antenna mounting substrate.

2. The sensor according to claim 1, wherein the antenna element is omni-directional or has a directivity in a direction orthogonal to a surface of the first wall, a surface of the third wall, and a surface of the fourth wall.

3. A sensor comprising:
a housing comprising a first wall, a second wall, a third wall, a fourth wall, and an internal space, wherein the first wall and the second wall are facing each other at a distance from each other, the third wall and the fourth wall connect the first wall and the second wall and are facing each other at a distance from each other and have a larger area than the first wall and the second wall respectively, and the internal space is surrounded by the first wall, the second wall, the third wall, and the fourth wall; and
an antenna element arranged in the internal space of the housing and receiving identification information of an external actuator for detecting opening/closing of a door,
wherein the antenna element is arranged at a position, which is closer to the first wall than the second wall and includes a substantially center in a direction connecting the third wall and the fourth wall,
wherein a length of the first wall in a direction parallel to the third wall and the fourth wall is greater than a length of the first wall in a direction orthogonal to the third wall and the fourth wall, and
the antenna element has a rod shape in which a length in a direction parallel to the first wall, the third wall, and the fourth wall is greater than a length in a direction orthogonal to the third wall and the fourth wall.

* * * * *